United States Patent
Willems-Peters et al.

(10) Patent No.: US 11,703,768 B2
(45) Date of Patent: Jul. 18, 2023

(54) LITHOGRAPHIC APPARATUS AND RELATED METHODS

(71) Applicant: ASML Netherlands B.V., Veldhoven (NL)

(72) Inventors: Alisia Mariska Willems-Peters, Eindhoven (NL); Sander Baltussen, Castenray (NL); Zhuangxiong Huang, Eindhoven (NL); Reinier Theodorus Martinus Jilisen, Eindhoven (NL); Sietse Wijtvliet, Apeldoorn (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/600,340

(22) PCT Filed: Mar. 10, 2020

(86) PCT No.: PCT/EP2020/056332
§ 371 (c)(1),
(2) Date: Sep. 30, 2021

(87) PCT Pub. No.: WO2020/200664
PCT Pub. Date: Oct. 8, 2020

(65) Prior Publication Data
US 2022/0171298 A1    Jun. 2, 2022

(30) Foreign Application Priority Data

Apr. 1, 2019  (EP) .................................... 19166555

(51) Int. Cl.
*G03F 7/20*     (2006.01)
*G03F 7/00*     (2006.01)

(52) U.S. Cl.
CPC ...... *G03F 7/70775* (2013.01); *G03F 7/70916* (2013.01); *G03F 7/70933* (2013.01)

(58) Field of Classification Search
CPC ............ G03F 7/70775; G03F 7/70916; G03F 7/70933
See application file for complete search history.

(56) References Cited

U.S. PATENT DOCUMENTS 7,050,152 B2 *  5/2006  Terashima ............. G03B 27/42
                                                             355/53
7,253,875 B1    8/2007  Luttikhuis et al.
(Continued)

FOREIGN PATENT DOCUMENTS

WO     WO 99/32940 A1     7/1999
WO     WO 2015/124344 A1  8/2015

OTHER PUBLICATIONS

International Search Report and Written Opinion of the International Searching Authority directed to related International Patent Application No. PCT/EP2020/056332, dated Jun. 12, 2020; 12 pages.
(Continued)

*Primary Examiner* — Hung V Nguyen
(74) *Attorney, Agent, or Firm* — Sterne, Kessler, Goldstein & Fox P.L.L.C.

(57) ABSTRACT

An apparatus comprising: a position monitoring system configured to determine the position of the substrate with respect to a projection system configured to project a radiation beam through an opening in the projection system and onto a substrate, wherein a component of the position monitoring system is located beneath the projection system in use; and a baffle disposed between the opening and the component.

16 Claims, 5 Drawing Sheets

(56) References Cited

U.S. PATENT DOCUMENTS

| | | | |
|---|---|---|---|
| 7,330,236 B2* | 2/2008 | Hasegawa | G03F 7/70891 |
| | | | 355/53 |
| 7,601,945 B2* | 10/2009 | Nagata | G01D 5/34746 |
| | | | 250/221 |
| 10,649,346 B2* | 5/2020 | Kaneko | G03F 7/70341 |
| 2002/0018190 A1* | 2/2002 | Nogawa | G03F 7/70883 |
| | | | 355/53 |
| 2005/0110966 A1 | 5/2005 | Hasegawa | |
| 2007/0035708 A1 | 2/2007 | Ina et al. | |
| 2007/0145269 A1 | 6/2007 | Buller et al. | |
| 2008/0073571 A1 | 3/2008 | Imoto et al. | |

OTHER PUBLICATIONS

"ResearchDisclosure," Research Disclosure No. 660050, Mar. 15, 2019; 7 pages.

* cited by examiner

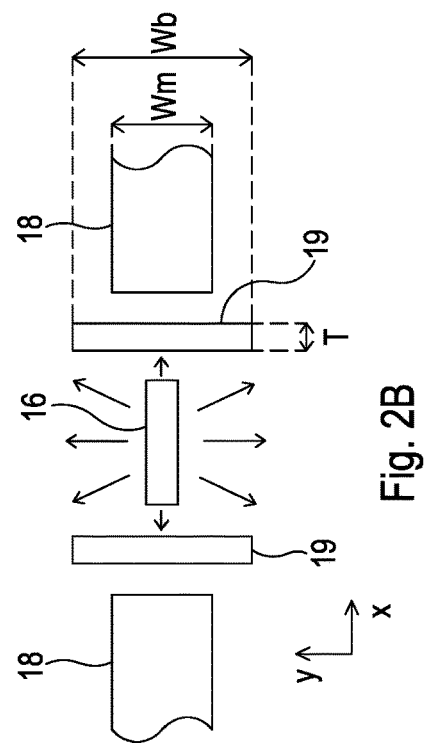
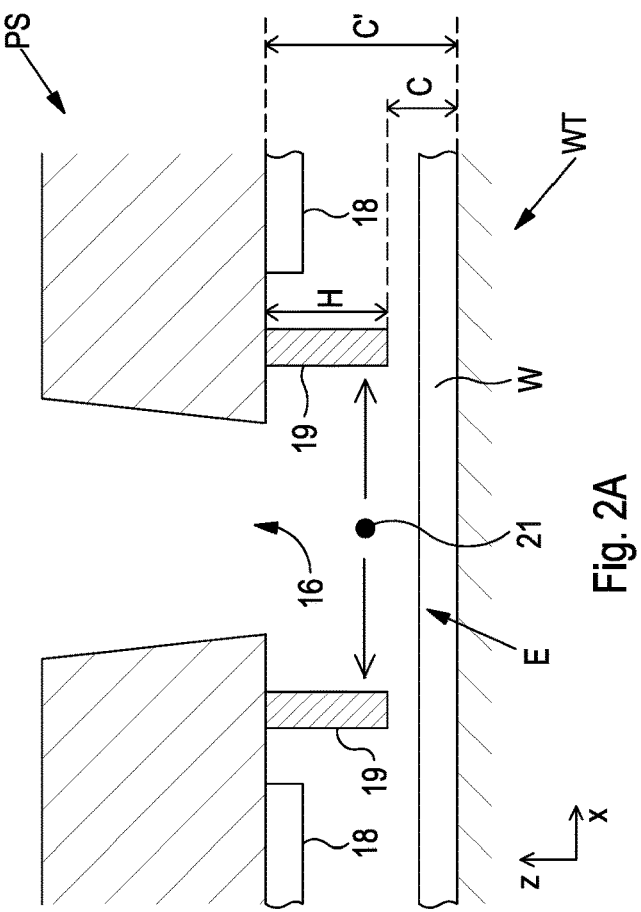
Fig. 2B
Fig. 2A

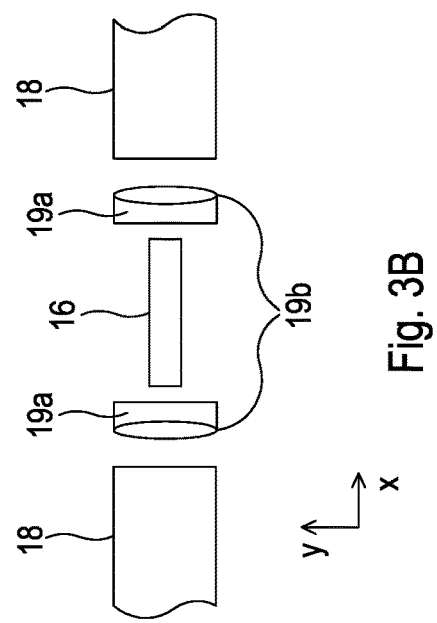
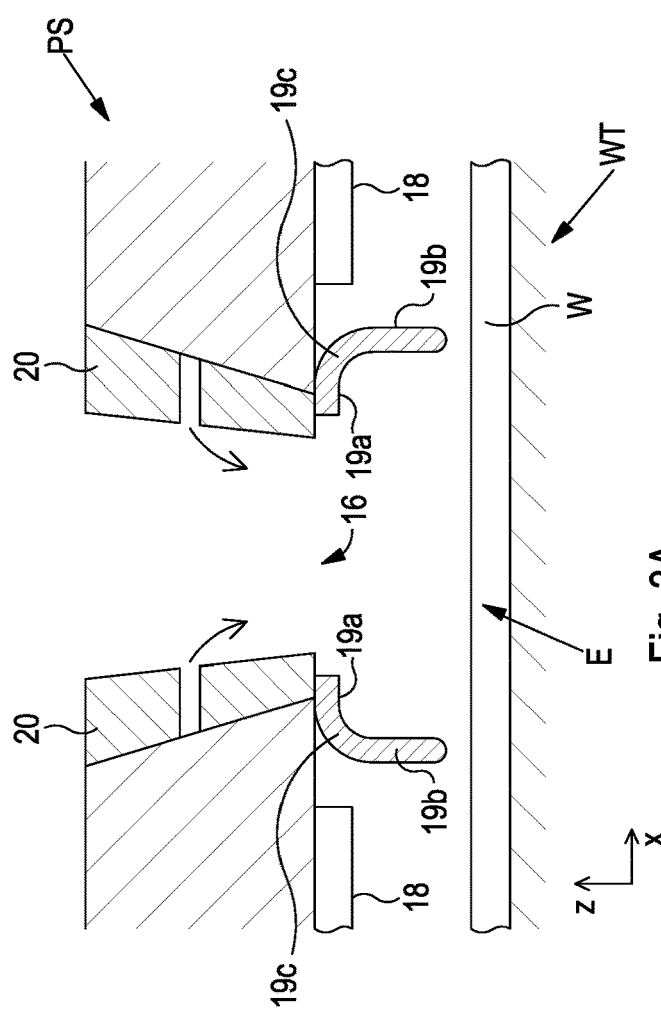

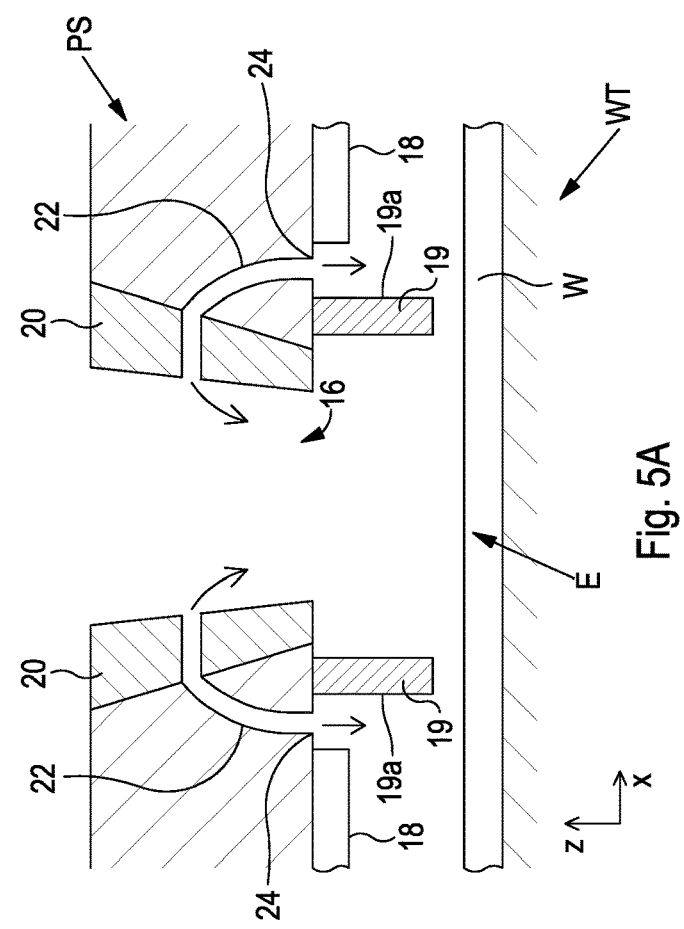
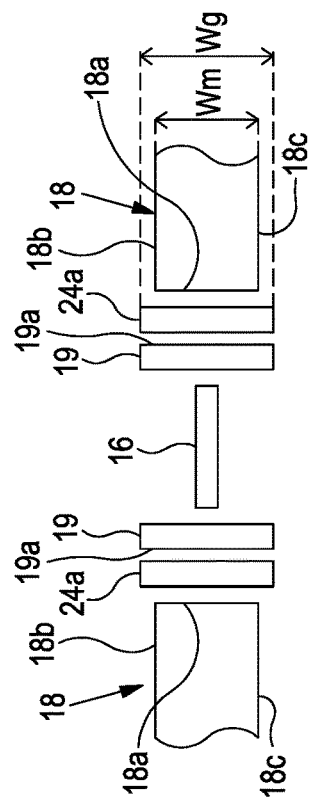
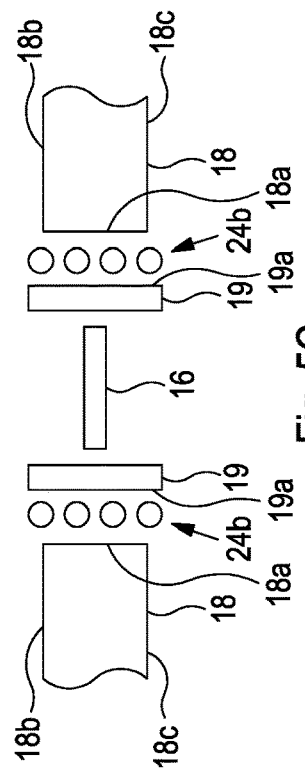

LITHOGRAPHIC APPARATUS AND RELATED METHODS

CROSS-REFERENCE TO RELATED APPLICATIONS

This application claims priority of EP application 19166555.3 which was filed on 1 Apr. 2019 and which is incorporated herein in its entirety by reference.

FIELD

The present invention relates to a lithographic apparatus, and related methods.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Incident radiation on the resist may cause the release of components such as volatile organic compounds from the resist, also known as outgassing. The outgassed components can adhere to and hence contaminate elements in the lithographic apparatus. Contamination of elements in the lithographic apparatus reduces the performance and lifetime of the apparatus.

It may be desirable to provide an improved lithographic apparatus that reduces the effect of contamination on performance and lifetime, or which overcomes some other disadvantage associated with lithographic apparatuses.

SUMMARY

According to a first aspect of the invention, there is provided a lithographic apparatus comprising a projection system configured to project a radiation beam through an opening in the projection system and onto a substrate, a position monitoring system configured to determine the position of the substrate with respect the projection system wherein a component of the position monitoring system is located beneath the projection system, and a baffle disposed between the opening and the component.

Lithographic apparatuses may experience contamination, for example due to outgassing from the resist on the substrate. Contamination on elements in the lithographic apparatus may reduce the performance and/or lifetime of the apparatus. Contamination on elements such as a component of the position monitoring system may reduce the efficacy of determining the position of the substrate with respect the projection system. The provision of a baffle in the lithographic apparatus may reduce or restrain the migration of contaminants from the substrate onto the component. The contaminants may be gaseous. Alternatively or additionally, the contaminants may be liquid or solid and suspended within a gas. The contaminants may be transferred through the lithographic apparatus via gas flow. A gas may transport contaminant particles from the substrate to the component. The baffle may deflect or restrict the flow of gas within the lithographic apparatus. The baffle may deflect gas flow from a portion of the substrate below the opening to at least a portion of the component. The deflection or restriction of gas flow may reduce the incidence of contaminant particles on the component. The baffle may block line of sight between the opening and a portion of the component. The baffle may block direct line of sight between at least a portion of the component and the area of the substrate directly beneath the opening. For example, the baffle may block line of sight between the area of the substrate directly beneath the opening and a first 5 cm of the component proximal the opening. The substrate may be located on a substrate table, which may be considered the location of the substrate in normal use of the lithographic apparatus.

The lithographic apparatus may be an EUV lithographic apparatus. The opening may at a lowermost end of the projection system. Lowermost may be interpreted as an end of the projection system proximal to the substrate. The opening may be configured to permit the projection of a radiation beam from the projection system onto the substrate. The opening may comprise a membrane configured to permit the radiation beam through the opening while preventing a flow of gas through the opening. The position monitoring system may comprise for example an interferometer or a linear encoder. The position monitoring system may be generally associated with the lithographic apparatus. A component of the position monitoring system may be provided below the position monitoring system. The component may be proximal to the opening. The component may be proximal to the substrate and/or a substrate table configured to support a substrate.

The component may comprise a reflective surface, for example a reflective surface associated with an interferometry system. The position monitoring system may reflect a laser beam off the reflective surface. The component may comprise a scale, for example a scale associated with a linear encoder. The component may comprise a sensor. The baffle may be provided to reduce contamination on a portion of the reflective surface, scale, or the like.

The baffle may have a baffle width. The baffle width may be measured perpendicular to a direction from the substrate to the component and a direction from the opening to the component. The baffle width may be defined in the scanning direction. The baffle may have a cross-sectional shape that is elongate along the baffle width. The component of the position monitoring system may have a component width measured parallel to the baffle width. The baffle width may be equal to or greater than the component width. Advantageously, a baffle with width equal to or greater than the component width may block all lines of sight between the opening and the component. Blocking direct lines of sight may more efficiently deflect gas flow and hence reduce the chance of contamination striking the component.

The lithographic apparatus may comprise a substrate table. The substrate table may be configured to support the substrate. In normal use of the lithographic apparatus a substrate may be disposed on the substrate table. The baffle may comprise a generally vertical portion which extends in a direction generally between the projection system and the substrate table. The generally vertical portion may deflect gas flow from an exposure area to the component. Advantageously this may reduce the movement of contaminants from the exposure area to the component. The exposure area may be an area of the substrate beneath the opening. The exposure area may be defined as the area of the substrate configured to receive radiation when the lithographic apparatus is in operation. The generally vertical portion may block direct lines of sight between the exposure area and at least a portion of the component. The generally vertical portion may for example block line of sight between the exposure area and a first 5 cm of the component proximal the opening.

A first portion of the baffle may extend along a first edge of the component. The first edge may be proximal to the opening. A second and third portion of the baffle may extend along a second and third edge of the component. The second and third edges may be adjacent to the first edge. The second and third edges may be perpendicular to the first edge. The baffle may generally extend around an end of the component proximal to the opening. For example, the first, second and third portions may form a C-shaped baffle which extends generally around an end of the component. Alternatively, second and third portions may be joined by a first portion to form a v-shape. In this instance, the second and third portions may generally extend around an end of the component proximal to the opening, and the first, second and third portions may extend along the first edge. Providing a baffle that generally extends around an end of the component may block more direct lines of sight between the exposure area and the component. As such, this may more effectively deflect the flow of gas between the exposure area and the component. As such, this may reduce the incidence of contaminants on the component A portion of the baffle may comprise a getter. That is, the baffle may comprise a surface that preferentially captures molecules that come into contact with it. Capture in this instance may be taken to comprise absorption, adsorption, chemical binding, or any process that causes the contaminant to adhere to the baffle. The getter may comprise a reactive material, for example aluminium, barium, magnesium, titanium, or a rare earth element. The getter may comprise a surface coating applied to the baffle.

A portion of the baffle may comprise a flexible material. The flexible material may be compliant such that, should it interact with a second body, it may flex. The portion may comprise, for example, a plastics material or rubber. Additionally or alternatively, a portion of the baffle may comprise a flexible structure. That is, the structure may be compliant such that, should it interact with a second body, it may flex. For example, the baffle may comprise multiple bristles, or a hollow structure. The baffle may comprise at least one plastic tube. A baffle comprising a flexible material and/or structure may minimize the impact of a baffle-substrate collision. That is, should the baffle strike the substrate, the damage caused to the substrate and/or baffle may be minimized.

The projection system may further comprise a dynamic gas lock. The opening of the projection system may correspond to an opening in the dynamic gas lock. The opening may further comprise a membrane configured to permit the travel of radiation but block the travel of gas. The dynamic gas lock may direct gas towards the substrate table. The presence of gas (whether static or dynamic) between the substrate and the projection system provides a barrier to any contaminants migrating from the substrate. If this gas is additionally moved towards the substrate, for example by flushing gas through the dynamic gas lock in a direction towards the substrate, this may provide an additional safeguard against contaminants reaching the projection system.

If the movement of gas from the dynamic gas lock is further optimized it may reduce the flow of gas from the substrate to the component.

The baffle may be integrally formed with the projection system. The baffle may be integrally formed with the dynamic gas lock. In this instance, the baffle may comprise a projection from the dynamic gas lock proximal to the opening, in a direction towards the substrate.

The lithographic apparatus may further comprise a supply line configured to deliver gas generally towards the substrate and/or substrate table. The supply line may be associated with the projection system, and in particular may originate from the dynamic gas lock. The gas may be hydrogen. Alternatively, the gas may be an inert gas, for example argon. The gas may be provided to form a gas curtain between the substrate and the component. The gas may provide a purge to restrict the flow of contamination-carrying gas from the substrate to the component.

The gas emitting end of the supply line may be disposed between the opening and the component. The gas emitting end may be associated with the projection system, and in particular the dynamic gas lock.

The gas emitting end of the supply line may be disposed between the baffle and the component. By optimizing the flow of gas in relation to the baffle, this may further deflect the flow of gas from the substrate to the component. As such, this may provide an additional safeguard against contaminants reaching the component. The provision of gas proximal to a face of the baffle proximal the component may provide an increased gas pressure behind the baffle. Behind may be interpreted as between the baffle and the component. An increased gas pressure behind the baffle may reduce the flow of gas from the substrate to the component. Alternatively or in addition, the gas emitting end of the supply line may be disposed at an end of the baffle proximal the substrate table. The gas supply line may be in an interior area of the baffle. The gas supply line and gas emitting end may be configured to provide gas flow from and end of the baffle proximal the substrate table to the substrate table.

The gas emitting end has a gas emitting end width. The gas emitting end width may be measured perpendicular to a direction from the substrate to the component and a direction from the opening to the component. The gas emitting end width may be defined as the extent of the gas emitting end in said direction. The gas emitting end may be continuous along the gas emitting end width, Alternatively, the gas emitting end may be discontinuous along the gas emitting end width, for example the gas emitting end may comprise multiple holes spanning a distance along said direction equal to the gas emitting end width, The gas emitting end width may be defined in the scanning direction. The component may have a component width measured parallel to the gas emitting end width. The gas emitting end width may be equal to or greater than the component width. Advantageously, a gas emitting end with width equal to or greater than the component width may reduce gas flow at all points between the opening and the component.

A first portion of a gas emitting end may extend along a first edge of the component. The first edge may be proximal to the opening. A second and third portion of the gas emitting end may extend along at least part of a second and third edge of the component. The second and third edges may be adjacent to the first edge. The second and third edges may be perpendicular to the first edge. The gas emitting end may generally extend around an end of the component proximal to the opening. For example, the first, second and third portions may form a C-shaped gas emitting end which extends generally around an end of the component. Providing a gas emitting end that generally extends around an end of the component may further reduce gas flow between the exposure area and the component. Providing a gas emitting end that generally extends around an end of the component may provide a contaminant-free purge gas flow to a greater portion of the component. As such, this may reduce the incidence of contaminants on the component According to a second aspect of the invention there is provided a method of reducing contamination of a lithographic apparatus, the method comprising: using a projection system to project a radiation beam through an opening in the projection system and onto an exposure area of a substrate, and using a position monitoring system to determine the position of the substrate with respect the projection system, wherein a component of the position monitoring system is located beneath the projection system, and wherein a baffle is provided between the opening and the component to deflect the flow of gas between the exposure area and the component.

The lithographic apparatus may be an EUV lithographic apparatus. The opening may at a lowermost end of the projection system. Lowermost may be interpreted as an end of the projection system proximal to the substrate. The opening may be configured to permit the projection of a radiation beam from the projection system onto the substrate. The opening may comprise a membrane configured to permit the radiation beam through the opening while preventing a flow of gas through the opening. The opening may be disposed beneath the projection system. Beneath may be interpreted as an end of the projection system proximal to the substrate. The position monitoring system may comprise for example an interferometer or a linear encoder. The position monitoring system may be generally associated with the lithographic apparatus. A component of the position monitoring system may be provided below the position monitoring system. The component may be proximal to the opening. The component may be proximal to the substrate and/or a substrate table configured to support a substrate.

Lithographic apparatuses may experience contamination, for example due to outgassing from the resist on the substrate. Contamination on elements in the lithographic apparatus may reduce the performance and/or lifetime of the apparatus. Contamination on elements such as a component of the position monitoring system may reduce the efficacy of determining the position of the substrate with respect the projection system. The provision of a baffle in the lithographic apparatus may reduce or restrain the migration of contaminants from the substrate onto the component. The contaminants may be gaseous. Alternatively or additionally, the contaminants may be liquid or solid and suspended within a gas. The contaminants may be transferred through the lithographic apparatus via gas flow. A gas may transport contaminant particles from the substrate to the component. The baffle may deflect or restrict the flow of gas within the lithographic apparatus. The baffle may deflect gas flow from a portion of the substrate below the opening to the component. The deflection or restriction of gas flow may reduce the incidence of contaminant particles on the component. The baffle may block direct line of sight between the opening and the component. The baffle may block direct line of sight between the component and the area of the substrate directly beneath the opening. The baffle may have a cross-sectional shape that is elongate in a direction perpendicular to both a direction from the opening to the substrate and a direction from the opening to the component. The elongation may extend such that there is no direct line of sight between any portion of the component and any portion of the opening.

The component may comprise a reflective surface, for example a reflective surface associated with an interferometry system. The position monitoring system may reflect a laser beam off the reflective surface. The component may comprise a scale, for example a scale associated with a linear encoder. The component may comprise a sensor. The baffle may be provided to reduce contamination on a portion of the reflective surface, scale, or the like.

The method may further comprise positioning the baffle to block a line of sight between the exposure area and at least a portion of the component. The baffle may have a baffle width. The baffle width may be measured perpendicular to a direction from the substrate to the component and a direction from the opening to the component. The baffle width may be defined in the scanning direction. The component may have a component width measured parallel to the baffle width. The baffle width may be equal to or greater than the component width. The baffle may have a cross-sectional shape that is elongate in a direction perpendicular to both a direction from the opening to the substrate and a direction from the opening to the component. Advantageously, a baffle with width equal to or greater than the component width may block all direct lines of sight between the opening and the component. Blocking direct lines of sight may more efficiently deflect gas flow and hence reduce the chance of contamination striking the component.

The method may further comprise providing the baffle with a baffle height defined as the extent of the baffle in a direction between the projection system and the substrate. The baffle height may be configured to block all lines of sight between the exposure area and at least a first 5 cm of the component proximal the opening.

The method may further comprise capturing contaminant particles by providing a portion of the baffle with a getter. That is, the baffle may be provided with a surface that preferentially captures molecules that come into contact with it. Capture in this instance may be taken to comprise absorption, adsorption, chemical binding, or any process that causes the contaminant to adhere to the baffle. The getter may comprise a reactive material, for example aluminium, barium, magnesium, titanium, or a rare earth element. The getter may comprise a surface coating applied to the baffle.

The method may further comprise providing additional gas flow from the projection system generally towards the substrate. The gas flow may be provided by a gas supply line. The supply line may be associated with the projection system, and in particular may originate from the dynamic gas lock. The gas may be hydrogen. Alternatively, the gas may be an inert gas, for example argon. The gas may be provided to form a gas curtain between the substrate and the component. The gas may provide a purge to restrict the flow of contamination-carrying gas from the substrate to the component. The supply line may be further configured to deliver gas towards the baffle. By optimizing the flow of gas in relation to the baffle, this may further deflect the flow of gas from the substrate to the component. As such, this may provide an additional safeguard against contaminants reaching the component. A portion of a gas emitting end of the supply line may be disposed between the opening and the component. A portion of the gas emitting end may be disposed at an end of the baffle proximal the substrate table. There may be a single supply line, or there may be multiple supply lines. One or more supply lines may be disposed in an interior region of a baffle.

The projection system may be provided with a dynamic gas lock. The opening of the projection system may correspond to an opening in the dynamic gas lock. The dynamic gas lock may direct gas towards the substrate table. The presence of gas (whether static or dynamic) between the substrate and the projection system provides a barrier to any contaminants migrating from the substrate. If this gas is additionally moved towards the substrate, for example by flushing gas through the dynamic gas lock in a direction towards the substrate, this may provide an additional safeguard against contaminants reaching the projection system. If the movement of gas from the dynamic gas lock is further optimized it may reduce the flow of gas from the substrate to the component. The baffle may be formed from a portion of the dynamic gas lock. In this instance, the baffle may comprise a projection from the dynamic gas lock proximal to the opening, in a direction towards the substrate. The gas emitting end may be associated with the projection system, and in particular the dynamic gas lock.

The method may further comprise providing increased gas pressure between the baffle and the component. The provision of gas proximal to a face of the baffle proximal the component may provide an increased gas pressure behind the baffle. Behind may be interpreted as between the baffle and the component. An increased gas pressure behind the baffle may reduce the flow of gas from the substrate to the component.

According to a third aspect of the invention there is provided a device manufactured using the apparatus or methods detailed above. The device may be an integrated circuit.

BRIEF DESCRIPTION OF THE DRAWINGS

Embodiments of the invention will now be described, by way of example only, with reference to the accompanying schematic drawings, in which:

FIGS. 2A and 2B depict a portion of a projection system comprising a baffle;

FIGS. 3A and 3B depict a portion of a projection system comprising a baffle in an alternative arrangement;

FIGS. 5A, 5B and 5C depict a portion of a projection system comprising a baffle and a gas supply line.

DETAILED DESCRIPTION

Figure 1:
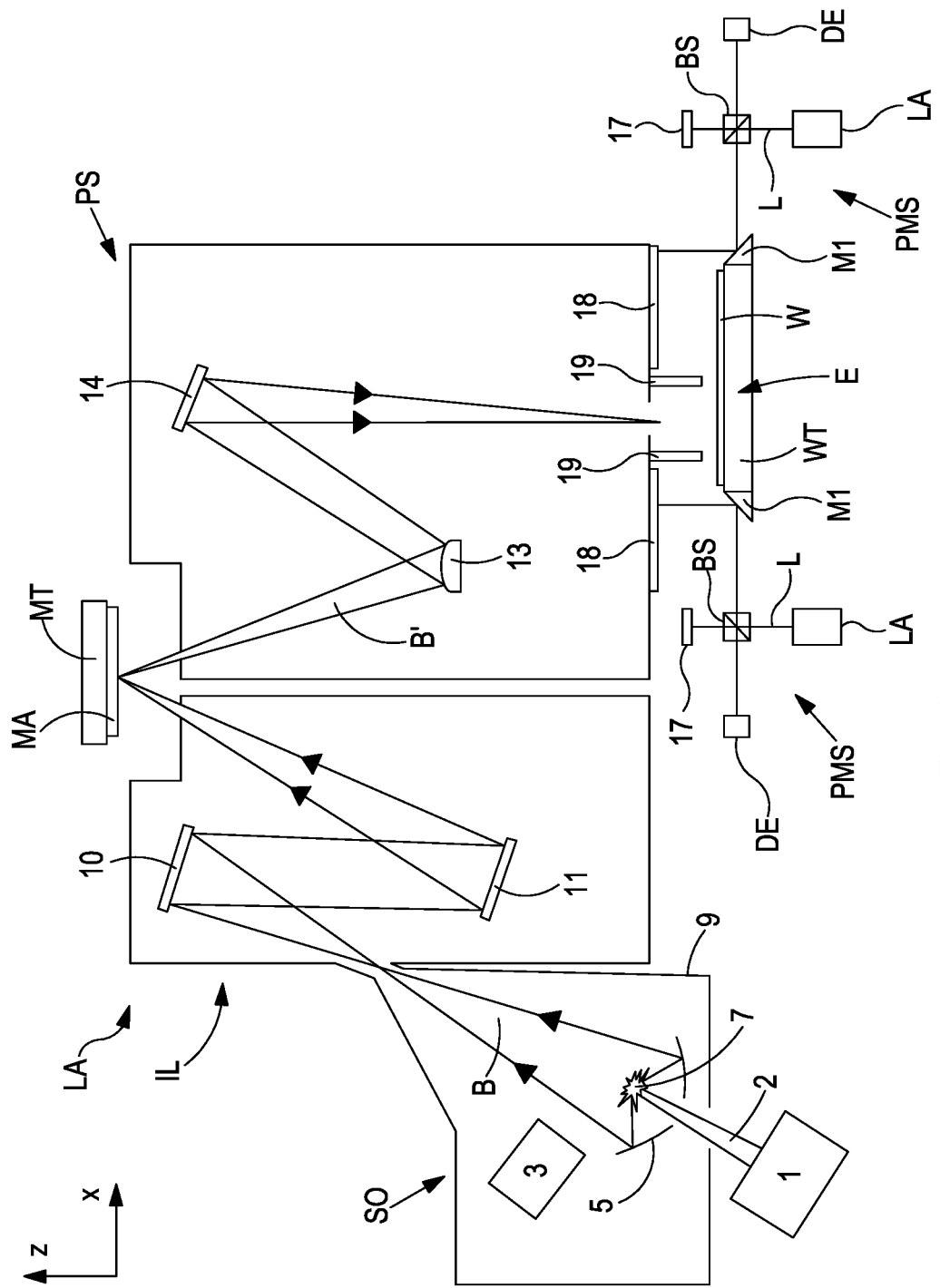
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W. The substrate may also be known as a wafer. The substrate table WT may also be referred to as a substrate support.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma. The radiation source SO may alternatively be a discharge produced plasma (DPP) source, a free electron laser (FEL) or any other radiation source that is capable of generating EUV radiation.

The illumination system IL is configured to condition the EUV radiation beam B before the EUV radiation beam B is incident upon the patterning device MA. The illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The radiation beam B' travels through an opening 16 in the projection system PS in order to exit the projection system PS and project onto a portion E of the substrate W. The portion E of the substrate W that is illuminated by the patterned radiation beam B' generally corresponds to an area of the substrate W directly below the opening 16, and may be referred to as an exposure area E.

In normal operation, for example during an exposure, a substrate W is supported on the substrate table WT. When in place, the substrate W is generally parallel to the substrate table WT. However, it should be understood that in some instances the substrate W may not be present. As such, any directional language featuring the substrate W (for example a direction towards the substrate W) may be considered to be synonymous with directional language featuring the substrate table WT (for example a direction towards the substrate table WT).

To clarify the invention, a Cartesian coordinate system may be used. The Cartesian coordinate system has three axes, i.e., an x-axis or x-direction, a y-axis or y-direction and a z-axis or z-direction. Each of the three axes are orthogonal to the other two axes. In this illustration of the apparatus, the x and y axes are taken to be in the plane of the substrate table WT, and the z-axis is taken to be perpendicular to the substrate table WT as depicted in FIG. 1. The x-axis is further taken to be parallel to the direction from the opening 16 to a mirror 18. The lithographic apparatus has a scanning direction, taken to be the direction in which the radiation is scanned across a portion of the substrate W. In this embodiment, the scanning direction is taken to be the y-direction. It should be understood that the use of a coordinate system is illustrative and non-limiting. It may be appreciated that it is possible to orient the apparatus in a different way without deviating from the scope of the invention. For example it should be understood that, while in an illustrated embodiment the direction from the opening 16 to the mirror 18 is perpendicular to the scanning direction, the opening 16 and mirror 18 may instead be aligned parallel to the scanning direction or in any other direction.

Directional language may also be used to clarify the invention. The projection system PS may be considered to be 'above' the substrate table WT. As such, the patterned radiation beam B' travels from the projection system PS to an exposure area E of the substrate W 'below' the projection system. Synonymously, above and below may be considered as relative terms along the z-axis as defined in FIG. 1. It should be understood that directional language is non-limiting and it is possible to orient the apparatus in a different way without deviating from the scope of the invention.

The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

The substrate table WT may be configured to accurately position the substrate support WT and hence the substrate W with respect the projection system PS. For example, the substrate support WT may be connected to a positioner such as a linear motor positioner.

Two position monitoring systems PMS may be provided to monitor the position of the substrate support WT, and hence the substrate W, with respect the projection system PS. In the depicted example, the position monitoring system PMS comprise an interferometry system. However, in alternative embodiments the position monitoring system PMS may be, for example, a sensor or a linear encoder comprising a scale. Many position monitoring systems PMS are known in the art. A component of the position monitoring system 18 will be generally associated with the area below the projection system PS. The component 18 may be disposed below the projection system PS and may for example be fixed to the bottom of the projection system PS. The component 18 may be an element of the position monitoring system PMS, for example a mirror in an interferometry system or a scale in a linear encoder. The component may be a sensor. The purpose of the portion 18 may be to provide a reference surface associated with the projection system PS, and hence aid determining the position of the substrate table WT with respect the projection system. In the depicted examples, the invention will be described with reference to an interferometry system PMS comprising a mirror 18. However, this should not be seen as limiting and it should be understood that the mirror 18 may be replaced by a different component of a position monitoring system PMS without deviating from the scope of the invention.

In the depicted example, each position monitoring system PMS comprises a reflective surface 18. The reflective surface 18 may also be referred to as a mirror or positioning mirror 18. The mirror 18 may be disposed below the projection system PS. The mirror 18 may be configured to receive and reflect a coherent light source, for example a laser beam L, which can be used to determine the displacement of the substrate table WT, and hence the substrate W, with respect the projection system PS.

The mirror 18 may be associated with the projection system PS. The mirror 18 may be fixed to the projection system PS. Alternatively, the mirror 18 may be associated with the substrate table WT. The mirror 18 may be fixed to the substrate table WT. The mirror 18 may be associated with the projection system PS or substrate table WT via an additional system member. For example, a frame may be provided to which the mirror 18 and the projection system PS and/or substrate table WT may be mounted, for example using air mounts, In the depicted example, the mirror 18 is associated with the projection system PS. In operation, a laser beam L may be generated by a laser LA. The laser beam L may be directed to a beamsplitter arrangement. The beamsplitter arrangement may comprise a beamsplitter BS to separate the laser beam L into a first portion and a second portion. The beamsplitter arrangement may also comprise at least one mirror 17 to direct the first portion of the laser beam L to a detector DE. The second portion of the laser beam L may be directed to a 45° mirror M1 fixedly connected to the substrate table WT at an angle of 45° with the x-y plane. It may be appreciated that the choice of angle 45° for the 45° mirror M1 is suitable for the depicted apparatus, but other geometries may be chosen, for example a 30° mirror or any other angle. The 45° mirror M1 is configured to direct the second portion of the laser beam L to the mirror 18. The mirror 18 reflects the second portion back to the 45° mirror M1, which may subsequently direct the second portion towards the photodetector. The photodetector may then use interferometry to determine a phase shift between the first and second portion of the laser beam L, in order to determine the displacement of the substrate table WT with respect the projection system PS.

In the depicted example, two position monitoring systems PMS are shown, each comprising one positioning mirror 18. However, a different number of position monitoring systems may be used. For example a single position monitoring system PMS or four position monitoring systems PMS. The depicted example shows a preferred arrangement for determining the displacement of the substrate W in the z-direction. Position monitoring systems and mirrors may additionally be used to determine the displacement of the substrate W in the x-direction and y-direction. A relative vacuum, i.e. a small amount of gas (e.g. hydrogen) at a pressure well below atmospheric pressure, may be provided in the projection system PS. The area surrounding the substrate W is at ambient pressure. The area surrounding the substrate W may be defined as the area generally between the substrate table WT and an end of the projection system PS proximal the substrate table WT. This area may also be known as a chamber.

In a manufacturing process using a lithographic apparatus, a pattern is imaged onto a substrate W that is at least partially covered in a layer of radiation-sensitive material, also known as a photoresist. The pattern is imaged by exposing the substrate W to the patterned radiation beam B', whereby the incident radiation chemically alters the photoresist such that subsequent processing techniques may be used to remove one or more portions of the photoresist as determined by the pattern. Exposure of the photoresist may result in the release of compounds, for example volatile organic compounds such as hydrocarbons. The release of compounds from the exposure of a photoresist may also be known as outgassing. Compounds released by outgassing may be referred to as outgassed compounds. Outgassed compounds may additionally or alternatively be released without exposure of the photoresist. That is, outgassing may occur spontaneously.

Outgassed compounds may be gaseous. Alternatively, outgassed compounds may be solid or liquid and may be suspended in a gas. Outgassed compounds may be transported around the lithographic apparatus via gas flow pathways. Outgassed compounds may also be known as contaminants.

Outgassing may be disadvantageous as the outgassed compounds may adhere to other elements within the lithographic apparatus, causing contamination. In particular, contaminants may adhere to a mirror 18 due to its proximity to the area of substrate W below the opening 16 i.e. the exposure area of the substrate W.

Contamination on a mirror 18 may significantly reduce the accuracy of the position monitoring system PMS. Precise position monitoring is beneficial for optimal operation of a lithographic apparatus. For example, precise position monitoring is advantageous to achieve locational accuracy of exposure and hence achieve high resolution exposure and overlay. As the amount of contamination on the mirror 18 increases, the performance of the lithographic apparatus may deteriorate. As a result of continued build-up of contamination on the mirror 18, the performance of the lithographic apparatus may deteriorate over time.

Contamination on a mirror 18 may significantly reduce the lifetime of the position monitoring system PMS. As more contamination adheres to the mirror 18, the performance of the position monitoring system PMS, and hence the lithographic apparatus, may fall below the performance requirements of the user. When a mirror 18 is significantly coated in contaminants it may become necessary to replace or clean said mirror. Cleaning may be performed manually, although this may be invasive and may require down-time in the lithographic process. Down-time in the lithographic process results in a loss of production time and hence reduces the output of the lithographic process. Cleaning may be automated and performed, for example, by chemical methods such as hydrogen radical generation, or by active heating. However, these automated cleaning methods may be difficult to implement due to the very limited space available in this portion of the lithographic apparatus. In addition, these automated cleaning methods may deposit heat and cause damage to the substrate W or lithographic apparatus. The mirror 18 may be replaced, although this may be costly and may require down-time in the lithographic process while the replacement takes place. It is instead beneficial to reduce the chance of contamination striking the optical elements within the lithographic apparatus.

The present invention reduces contamination on the mirror 18 by providing a baffle 19 between the opening 16 and the mirror 18. The baffle 19 is provided to deflect the flow of gas between the exposure area E of the substrate W (i.e. the area of the substrate W below the opening 16) and the mirror 18. The baffle 19 may block direct line of sight between the exposure area E and the mirror 18. As a result, many gas flow pathways from the exposure area E to the mirror 18 are blocked by the baffle 19 and hence the gas flow is deflected. The gas flow may comprise contaminants, so deflecting gas flow may resultantly deflect contaminants. Hence, the use of a baffle 19 may reduce the chance of contamination striking the mirrors 18.

While reference may be made in this text to the flow of gas and/or contaminants from the substrate W to the mirror 18, this may be interpreted as the flow of gas and/or contaminants from the exposure area E of the substrate W. Contaminants are generally released in response to incident radiation B' which travels through the opening 16 and onto the exposure area E of the substrate W.

Optimization of the size, shape, and position of the baffle 19 and the surrounding area may increase its efficiency in reducing the chance of contamination striking the mirrors 18. Some example arrangements are described in more detail further below.

In some example implementations a dynamic gas lock (DGL) may be provided to reduce any flow of gas from the substrate W to the projection system PS. A DGL may direct gas towards the substrate table. The flow of gas towards the substrate table WT from the projection system PS provides a barrier to any contaminants migrating into the projection system from the substrate W. The DGL may include a membrane which is substantially transparent to radiation but which blocks the flow of gas into the projection system PS. Where this is the case, the flow of gas from the DGL will prevent or reduce build-up of contamination on the membrane. However, the gas flow from the DGL may introduce additional gas flow pathways which may increase the chance of contaminants migrating from the substrate W onto the mirrors 18. As such, in apparatuses utilizing a DGL, the use of a baffle 19 is particularly advantageous in order to deflect the flow of gas from the substrate W and the mirrors 18 and hence reduce the effects of contamination on the lithographic apparatus.

Some example embodiments of a lithographic apparatus comprising a baffle 19 between the opening 16 and the mirror 18 will now be described with reference to FIGS. 2 to 5.

FIGS. 2A and 2B depict a portion of a projection system PS and substrate table WT according to an embodiment of the present invention. The projection system PS comprises an opening 16 through which radiation exits the projection system PS. The opening 16 is depicted schematically as rectangular, but it may be understood that this is illustrative and not limiting and other shape openings may be used. For example, the opening may be curved. The projection system PS further comprises two mirrors 18 associated with two position monitoring systems. Other components of the position monitoring systems are not shown for simplicity.

A substrate W is positioned on a substrate table WT below the projection system PS. The substrate W has an exposure area E, defined as the area of the substrate W below the opening 16. That is, the exposure area E is an area of the substrate W configured to receive radiation when the lithographic process is in operation. An outgassed compound 21 is shown, having been released from the surface of the substrate W, for example after photoexposure of a resist on the substrate W.

Arrows illustrate potential gas flow pathways in the lithographic apparatus. If the baffles 19 were not present, gas flow would be isotropic around the exposure area E. As a result, contamination carried within a gas would travel in all directions and, in particular, would travel towards the mirrors 18. Unimpeded, gas flow in the x-direction may allow the outgassed compound 21 to migrate from the substrate W towards the mirrors 18. In practice, unless gas flow pathways are deflected, contamination may be deposited around the opening 16 in all directions. For example, contamination may be deposited in a ring around the opening 16, with the ring coating portions of the mirrors 18.

In this embodiment a baffle 19 is placed between the opening 16 and each mirror 18 (i.e. two baffles 19 are provided). The baffles 19 are positioned to deflect or restrict the flow of gas within the lithographic apparatus. In particular, the baffle 19 is positioned to deflect the flow of gas travelling from the exposure area E towards the mirrors 18. It can be seen that gas flow in the x-direction is impeded by the baffle 19. As such, any contaminants carried by the gas will be less likely to travel to, and adhere to, the mirrors 18. The baffle 19 therefore reduces the chance of incidence of contaminant particles 21 on the mirrors 18.

The baffle 19 can be optimized by configuring it such that a portion of the baffle acts as a getter. Getters are known in the art and preferentially capture molecules that come into contact with them. Getters are especially used in lower pressure environments to capture unwanted (i.e. contaminant) compounds. Capture in this instance may be taken to comprise absorption, adsorption, chemical binding, or any process that causes the contaminant to adhere to the getter. Using a getter in conjunction with the baffle 19 may further reduce the chance of contaminants reaching the mirror 18. Many getters are known in the art, for example the getter may comprise a reactive material such as aluminium, barium, magnesium, titanium, or a rare earth element. The getter may be a portion of the baffle 19, or the entire baffle 19 may comprise a getter. The getter may be a surface coating on the baffle 19.

While two baffles 19 are provided in this embodiment, a different number of baffles may be provided in other embodiments. For example, a lithographic apparatus comprising one position monitoring system PMS with one mirror 18 may only need one baffle 19. It may be advantageous to provide the same number of baffles 19 as mirrors 18.

The baffle 19 may have a baffle height H defined as the distance from an end of the baffle 19 proximal to the substrate table WT to an end of the baffle 19 proximal to the projection system PS. If the baffle 19 is attached directly to the projection system PS, the baffle height H is the distance from the end of the baffle 19 proximal the substrate table WT to the projection system PS. In the illustrated example, the baffle height H is the extent of the baffle 19 in the z-direction.

The baffle 19 may have a baffle width Wb defined as the extent of the baffle 19 in the y-direction. The baffle 19 may have a baffle thickness T defined as the extent of the baffle 19 in the x-direction.

The baffle may 19 block direct line of sight between the exposure area E and the mirror 18. The baffle 19 may extend along an edge of the mirror 18 that is proximal to the opening 16. The mirror 18 may have a mirror width Wm. Beneficially, the baffle 19 may have a baffle width Wb that is equal to or greater than the mirror width Wm. The baffle 19 may extend beyond the edges of the mirror 18. Having a baffle width Wb greater than the mirror width Wm may allow the baffle 19 to block more lines of sight between the exposure area E and the mirror 18.

Gas deflected by the baffle 19 may flow around the edges of the baffle 19. A baffle width Wb greater than the mirror width Wm may reduce the amount of gas flow around the baffle 19. A baffle width Wb greater than the mirror width Wm may prevent gas which flows around the edges of the baffle 19 from subsequently flowing over the mirror 18.

The baffle 19 is disposed between the projection system PS and the substrate table WT which generally supports a substrate W. As such, it has a defined space within which it can reside. This space may be referred to as a chamber. The chamber has a chamber height C' defined as the distance between the substrate table WT and an end of the projection system PS proximal to the substrate table WT, measured in the z-direction.

There are movements and tolerances associated with lithographic processes and as such the chamber height C' may change when in use. For example, to change the focus of radiation during a lithographic exposure the substrate table WT may be moved in the z-direction which may alter the chamber height C'. There are hence a range of chamber heights C' that may exist during normal use of the lithographic apparatus. When considering the chamber height C' and clearance C, it should be understood that in normal operation a substrate W will be supported on the substrate table WT. As a result, the distance between the substrate W and the baffle 19 will be smaller than the chamber height C'. The clearance C may be sufficiently large that, during normal operation of the lithographic apparatus with a substrate W present, the baffles 19 will not touch the substrate W. Normal operation may include planned events such as lithographic exposure and scanning. Normal operation may include uncontrolled events such as earthquakes.

An earthquake may occur when using the lithographic apparatus. This may move the substrate table W further towards the projection system PS than would be the case during normal use of the lithographic apparatus. As such, there is a risk that movement of the substrate table WT may result in the baffle 19 striking the substrate W. The same may also apply if the lithographic apparatus malfunctions. Any impact between the baffle 19 and substrate W may damage the baffle 19 and/or the substrate W. Damage to the substrate may result in reduced quality output, and/or may result in a time penalty for example if the lithographic process needs repeating. If the substrate W should break, it may shatter and release additional contaminant compounds into the lithographic apparatus which may hence require cleaning. The clearance C may be such that the chances of impact are low. However, it might not be possible to completely eliminate the change of an impact.

To increase the effectiveness of the baffle 19 in deflecting gas flow, it may be beneficial to provide the baffle 19 with a larger baffle height H. This is because an increased baffle height H may block more direct lines of sight between the exposure area E and the mirrors 18. If the baffle height H is too small, gas may be able to flow from the exposure area E to the mirror 18 unimpeded. The baffle 19 may block some direct lines of sight between the exposure area E and the mirror 18. Advantageously, the baffle 19 may be provided with a baffle height H large enough to block all lines of sight between the exposure area and a portion of the However, an increased baffle height H results in a smaller clearance C. If the clearance C is too small, the risk of collision may increase. The clearance C may be, for example, greater than 3 mm. A clearance C of greater than 3 mm may be advantageous for reducing the risk of collision between a conventional substrate and a baffle 19. It should be understood that a clearance C of greater than 3 mm is calculated using the thickness of a conventional substrate. A conventional substrate may have a thickness of approximately 775 micron. The thickness of the substrate W may change over the plane of the substrate, for example due to uneven thicknesses. The clearance C may take the thickness of the substrate W into account. With a thicker substrate W, a larger clearance C may be beneficial. In other situations a smaller clearance C than 3 mm may be sufficient, for example in a location with a smaller risk of earthquakes.

It may be understood that different baffle heights H and baffle clearances C may be advantageous in different lithographic apparatuses, for example with a different chamber height H' or different focusing conditions. As such, the baffle height H and clearance C may be chosen to suit the user. The baffle height H may be considered in relation to the cavity height C'. For example, a baffle ratio of baffle height H to cavity height C' may be calculated as H/C. A baffle ratio of over 20% may be advantageous for the deflection of gas flow from the exposure area E to the mirror 18.

The baffle height H may instead be considered in terms of its ability to block line of sight, and hence its ability to deflect gas flow along that line of sight. For example, the baffle height H may be configured such that it blocks all direct line of sight between the exposure area E and a portion of the mirror 18. This portion may be an area of the mirror 18 that would receive a significant amount of contamination if the baffle 19 was not present. It should be understood that the size of this area may vary dependent on the lithographic apparatus and/or process. In an example embodiment, a baffle height H may be provided to block line of sight between the exposure area E and the first 5 cm of the mirror 18 closest to the opening. It should be understood that for other lithographic processes, it may be beneficial to block line of sight to a larger or smaller distance of the component, for example, but not limited to, 2 cm or 10 cm.

To reduce the effect of an impact, the baffle 19 or a portion of the baffle 19 may comprise a flexible material. The flexible material may be compliant such that, should it interact with a second body, it may flex. As such, if the baffle 19 strikes the substrate W, the damage caused to the substrate W and/or baffle 19 may be minimized. The flexible material may be, for example, a plastics material or rubber. Additionally or alternatively, a portion of the baffle 19 may comprise a flexible structure, for example multiple thin bristles, or a hollow structure such as one or more plastic tubes. If using plastic tubes, the tubes may be orientated vertically i.e. extending from the projection system PS to the substrate W. A flexible structure may be interpreted as a structure that is designed to be compliant such that, should it interact with a second body, it may flex. It may be understood that, although a compliant material and/or structure may be beneficial, the baffle 19 should still be stiff enough to deflect the flow of gas. That is, it may flex upon contact with the substrate W, but may remain generally undeformed when gas flows towards it in the lithographic apparatus.

In the example depicted in FIGS. 2A and 2B, the baffle 19 is cuboid in shape. This shape beneficially provides a barrier to deflect gas flow. However, the shape of the baffle 19 can be optimized to control gas flow within the chamber. For example, turbulent flow may be reduced by providing the baffle with curved edges. Some examples of alternative baffle shapes are described below with reference to FIGS. 3 and 4.

FIGS. 3A and 3B depict a baffle 19 with a horizontal portion 19a and a vertical portion 19b. The baffle here extends for a significant length in the x-direction before extending downwards in the z-direction. In this instance, the baffle shape is generally L-shaped. In particular, a curved portion 19c joins the horizontal and vertical portions 19a, 19b together. This shape may be beneficial for manufacturing purposes.

In this example, the projection system PS further comprises a dynamic gas lock (DGL) 20. As previously mentioned, a DGL 20 may direct gas towards the substrate table WT, as indicated by gas flow arrows in FIG. 3A. The DGL 20 is provided with gas through supply lines, which may originate from another portion of the projection system PS or an external source (not shown). The DGL 20 is provided to reduce the chance of gases travelling upwards into the projection system PS, as well as to provide a barrier to any contaminants 21 migrating from the substrate W to the projection system PS. In apparatuses utilizing a DGL 20, the use of a baffle 19 is particularly advantageous. This is because additional gas flow pathways are present, and the baffle 19 may advantageously deflect the flow of contaminant-carrying gas and hence reduce the effects of contamination on the lithographic apparatus. When using a baffle 19 in combination with a DGL 20, the baffle 19 or a portion of the baffle 19a, 19b, 19c may be integrally formed with the DGL 20.

Figure 4B:
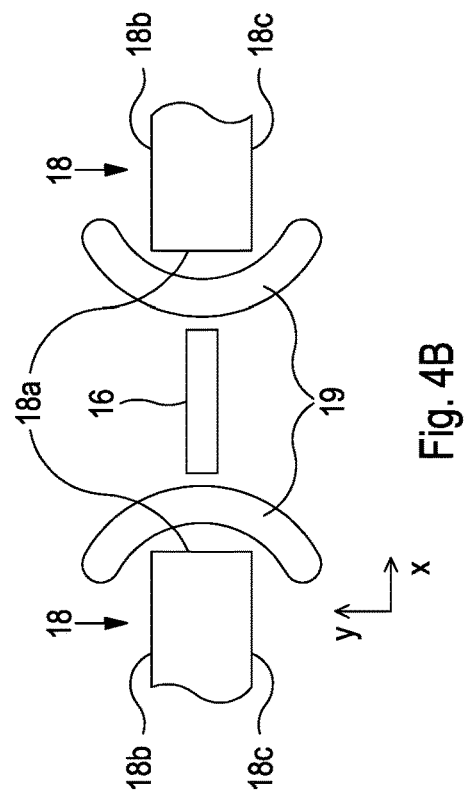
FIGS. 4A and 4B depict a portion of a projection system comprising a baffle in an alternative arrangement.
Figure 4A:
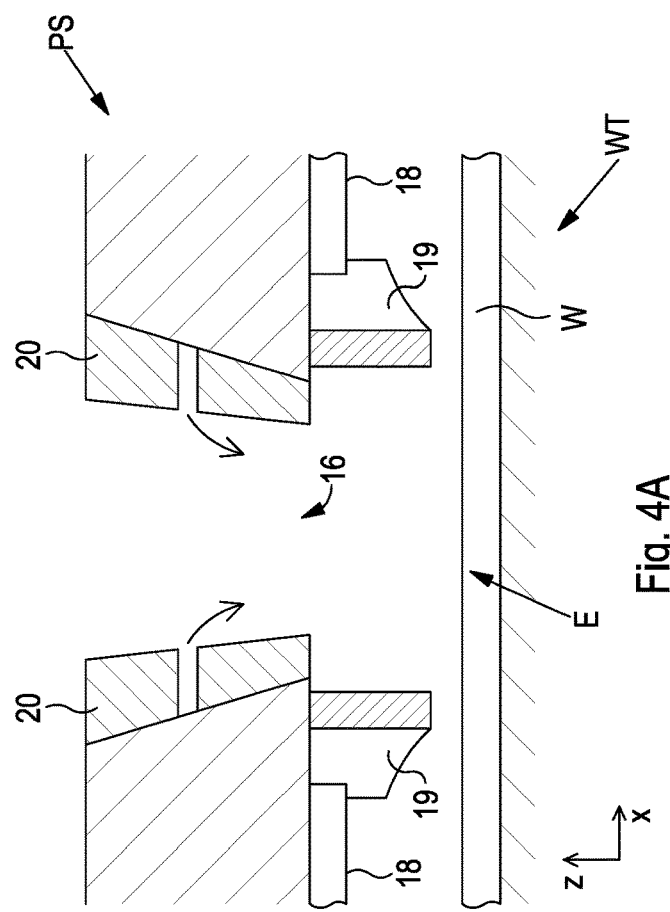

Another alternative baffle shape is depicted in FIGS. 4A and 4B. In this embodiment, the baffles 19 are curved when viewed from below. The baffles 19 may extend along a proximal edge 18a of their mirror 18 (the proximal edge 18a of the mirror 18 being the edge which is closest to the opening 16). Due to their curvature, the baffles 19 may also extend partially along the adjacent sides 18b, 18c of the mirrors 18. Advantageously, this shape partially encloses the end of the mirror 18 proximal to the opening 16. Partially enclosing an end of a mirror 18 blocks more direct lines of sight between the substrate W and the mirrors 18. This further reduces the chance of contaminants striking the mirrors 18. It may be understood that, while a C-shape has been illustrated here, a similar effect could be achieved using another shape of baffle 19 that extends around the sides 18b, 18c of the mirrors 18 which are adjacent to the proximal ends of the mirror.

Alternatively, the baffles 19 may be shaped such that they are "v-shaped" when viewed from below. That is, a single baffle 19 may comprise a first and second straight portion joined together at a first end of the first portion and a first end of the second portion, where the join is made at an angle to parallel such that the first and second portions form a chevron or v-shape. The angle may be altered to form a narrower or wider v-shape. A v-shaped baffle 19 may beneficially deflect gas flow from the mirrors 18. A v-shaped baffle 19 may extend generally around the adjacent sides 18b, 18c of a mirror 18 and hence partially encloses the end of the mirror 18 proximal to the opening 16.

The projection system PS in FIGS. 4A and 4B also comprises a DGL 20. In some instances, the use of a DGL 20 in combination with a baffle 19 may be beneficial. In particular, the flow of gas from the DGL 20 can be further optimized with respect the baffles 19, which may help further deflect the flow of gas from the substrate W to the mirror 18. Additionally, gas supply lines may already be present in DGL components so implementing new gas supply pathways is feasible. Some example implementations of optimizing gas flow are described below, with reference to FIGS. 5A-C.

The projection system PS in FIGS. 5A-C comprises two baffles 19 and two gas supply lines 22. The gas supply lines 22 are configured to deliver gas generally towards the substrate W and/or substrate table WT. This gas may form a gas curtain between the substrate W and the mirrors 18 and hence reduce the flow of contamination-carrying gas from the substrate W to the mirrors 18. This may also be referred to as a local purge, purge flow, or purge gas flow. The local purge may help deflect gas flow from the substrate W to the mirrors 18. The local purge may also ensure that clean (i.e. contaminant free) gas is flowing over the mirrors 18, which further reduces the chance of contaminants adhering to the mirrors 18. The purge gas may displace contaminant-carrying gas in the vicinity of the mirrors 18.

In the depicted example, the gas is provided by gas supply lines 22 associated with the DGL 20. Alternatively, the gas supply lines 22 may be associated with the projection system PS, for example delivered through delivery tubes attached to the underside of the projection system PS. If using gas supply lines 22, there may be the same number of supply lines 22 as baffles 19 and/or mirrors 18. For example, if using just one baffle 19 there may be one supply line 22. Alternatively, one supply line may be used to supply gas flow in the vicinity of multiple baffles. Alternatively, there may be multiple supply lines 22. Where there are multiple supply lines 22, it may be configured such that there are multiple supply lines associated with a single baffle 19, or multiple supply lines associated with multiple baffles. The gas may be hydrogen. The use of hydrogen may be advantageous as hydrogen is already used in some known lithographic processes. The gas may be non-reactive, for example an inert gas such as argon. Argon may be used advantageously as it is a heavier molecule than hydrogen so may provide more suppression of outgassed compounds. However, argon may less easily available and/or more expensive than hydrogen.

A supply line 22 may comprise a gas emitting end 24. Gas within the supply line 22 may enter the chamber below the projection system PS from the gas emitting end 24. The gas emitting end 24 of the supply line 22 may be configured such that the gas flow is provided between an end of the baffle 19 proximal the substrate table WT or substrate W. For example, a gas supply line 22 may be disposed inside a baffle 19. A gas emitting end 24 of a said supply line may be located at the end of a baffle 19 proximal the substrate table WT. As such, injecting gas into the baffle 19 via the gas supply line 22 may cause gas to flow from the end of the baffle 19 downwards and towards the substrate table WT. Gas flow the end of the baffle 19 may reduce the flow of gas from the exposure area E to the mirrors 18.

Alternatively or additionally, the gas emitting end 24 of the supply line 22 may be disposed between the opening 16 and the mirror 18. In particular, the supply line 22 may be configured to deliver gas near a face 19a of the baffle 19 proximal to the mirror 18. This may be achieved by providing a gas emitting end 24 of the supply line between the baffle 19 and the mirror 18. The gas emitting end 24 and the supply line 22 may be directed such that they cooperate to direct gas near the face 19a of the baffle 19 proximal to the mirror 18. In this instance, the gas is still directed downwards, i.e. from the projection system PS towards the substrate W, but may be directed such that it travels downwards along this face 19a of the baffle 19. The provision of gas near this face 19a may provide an increased gas pressure in the area between the baffle 19 and the mirror 18. An increased gas pressure in this area may reduce the flow of gas from the exposure area E to the mirror 18 due to a pressure difference.

A gas supply line 22 may be used in conjunction with the use of a baffle 19. This may be advantageous as it represents an effective way of reducing the chance of contaminants striking the mirror 18. This is because the baffle 19 may deflect gas flow between the exposure area E and the mirror 18, and the gas supply line 22 may further reduce gas flow between the exposure area E and the mirror, as well as providing a purge gas flow of contaminant-free gas. In another example, a gas supply line 22 may be used without a baffle 19. For instance, a gas emitting end 24 of a gas supply line 22 may be disposed between the opening 16 and a mirror 18 when no baffle is present. The disposal of a gas emitting end 24 of a supply line 22 between the opening 16 and a mirror 18 may provide a gas curtain which may reduce the flow of gas from the exposure area E to the mirror 18. Additionally, the provision of a gas purge flow may be significant enough to satisfactorily reduce the chance of contaminants striking the mirror 18 by providing contaminant-free gas flow over the mirror 18, without the use of a baffle 19. However, it is preferable to use a gas supply line 22 in combination with a baffle 19 to achieve a more effective reduction in contamination of the lithographic apparatus.

The arrangement of the gas emitting ends 24 of the supply lines 22 may be selected to beneficially control the flow of purge gas. Two examples of gas emitting ends 24 are shown in FIGS. 5B and 5C. The baffles 19 in these examples are shaped similarly to that in FIG. 2, but it may be understood that any shape or size baffle 19 may be used with a gas supply line 22.

In the arrangement shown in FIG. 5B, the gas emitting ends 24 are elongate in cross-section. An elongate gas emitting end 24 may also be referred to as a slot. In particular, the elongation extends in the y-direction. The elongate width Wg of the gas emitting end 24 may be equal to or greater than the mirror width Wm. This may be advantageous as it may provide a gas curtain along the full extent of the mirror 18 in the y-direction. It may also provide a contaminant-free purge flow to more areas of the mirror 18, further reducing the risk of contaminants adhering to the mirror 18. The elongate width Wg of the gas emitting end 24 may be equal to or greater than the baffle width Wb. This may be advantageous as it may reduce gas flow at all points between the baffle 19 and the mirror 18.

Rather than elongate gas emitting ends, an alternative arrangement is shown in FIG. 5C. This example utilizes gas emitting ends 24 that comprise multiple holes. The multiple holes 24 in this example are arranged in a line such that they form an elongate row of holes 24 extending in the y-direction. A row of holes may be beneficial as such holes may be more easily manufactured compared to an elongate slot. Similar to the example in FIG. 5B, it may be advantageous for the row of holes 24 to extend for a width equal to or greater than the mirror width Wm. This may be advantageous as it may provide a gas curtain along the full extent of the mirror 18 in the y-direction. It may also provide a contaminant-free purge flow to more areas of the mirror 18, further reducing the risk of contaminants adhering to the mirror 18. The row of holes 24 may extend for a width equal to or greater than the baffle width Wb. This may be advantageous as it may reduce gas flow at all points between the baffle 19 and the mirror 18. Four holes are shown in the depicted example, but any number of holes may be used. In this example, the row of holes 24 extends along a first side of the mirror 18.

In the depicted arrangements in FIGS. 5B and 5C, the gas emitting ends 24 extends along an edge 18a of the mirrors 18 proximal to the opening 16. It may be beneficial to configure the gas emitting end 24 to further extend along a portion of the adjacent sides 18b, 18c of the mirrors 18. For example, similar to the baffles 19 depicted in FIG. 3A-B, the gas emitting ends 24 may be curved such that they generally extend around an end of the mirror 18 proximal to the opening 16. Extending around an end of the mirrors 18, the gas emitting ends 24 may advantageously create a more efficient barrier, shielding a larger portion of the mirror 18 from contaminants travelling from the substrate W. Extending around an end of the mirrors 18, the gas emitting ends 24 may advantageously provide a contaminant-free purge gas flow to a larger area of the mirrors 18.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Clause 1. A lithographic apparatus comprising: a projection system configured to project a radiation beam through an opening in the projection system and onto a substrate; a position monitoring system configured to determine the position of the substrate with respect the projection system, wherein a component of the position monitoring system is located beneath the projection system; and a baffle disposed between the opening and the component.

Clause 2. The lithographic apparatus of clause 1, wherein the component comprises a reflective surface of an interferometer or a scale of a linear encoder Clause 3. The lithographic apparatus of clause 1 or 2, wherein the baffle has a baffle width, the component has a component width measured parallel to the baffle width, and the baffle width is equal to or greater than the component width.

Clause 4. The lithographic apparatus of any preceding clause, further comprising a substrate table configured to support the substrate, wherein the baffle comprises a generally vertical portion which extends in a direction generally between the projection system and the substrate table.

Clause 5. The lithographic apparatus of any preceding clause, wherein a first portion of the baffle extends along a first edge of the component proximal to the opening, and a second and third portion of the baffle extend along at least part of a second edge and a third edge of the component, wherein the second and third edges are adjacent the first edge.

Clause 6. The lithographic apparatus of any preceding clause, wherein a portion of the baffle comprises a getter.

Clause 7. The lithographic apparatus of any preceding clause, wherein a portion of the baffle comprises a flexible material.

Clause 8. The lithographic apparatus of any preceding clause, wherein the projection system further comprises a dynamic gas lock, and wherein the opening of the projection system corresponds to an opening in the dynamic gas lock.

Clause 9. The lithographic apparatus of any preceding clause, wherein the baffle is formed integrally with the projection system.

Clause 10. The lithographic apparatus of any preceding clause, further comprising a supply line configured to deliver gas generally towards the substrate.

Clause 11. A method of reducing contamination of a lithographic apparatus, the method comprising: using a projection system to project a radiation beam through an opening in the projection system and onto an exposure area of a substrate; and using a position monitoring system to determine the position of the substrate with respect the projection system, wherein a component of the position monitoring system is located beneath the projection system; wherein a baffle is provided between the opening and the component to deflect the flow of gas between the exposure area and the component.

Clause 12. The method according to clause 11, wherein the component comprises a reflective surface of an interferometer or a scale of a linear encoder.

Clause 13. The method according to clause 11 or 12, wherein the baffle is positioned to block line of sight between the exposure area and at least a portion of the component.

Clause 14. The method according to any of clauses 11 to 13, wherein the baffle is provided with a baffle height defined as the extent of the baffle in a direction between the projection system and the substrate, and the baffle height is configured to block all lines of sight between the exposure area and at least a first 5 cm of the component proximal the opening.

Clause 15. The method according to any of clauses 11 to 14, the method further comprising capturing contaminant particles with a getter.

Clause 16. The method according to any of clauses 11 to 15, the method further comprising providing additional gas flow from the projection system towards the substrate.

Clause 17. The method according to clause 16, the method further comprising providing increased gas pressure between the baffle and the portion of the position monitoring system.

Clause 18. A device manufactured using the apparatus of any of clauses 1 to 10 or according to the method of any of clauses 11 to 17.

The invention claimed is:

1. An apparatus comprising:
a position monitoring system configured to determine a position of a substrate with respect to a projection system configured to project a radiation beam through an opening in the projection system and onto the substrate, wherein a component of the position monitoring system is located beneath the projection system in use, and wherein the component comprises a reflective surface of an interferometer or a scale of a linear encoder; and
a baffle disposed between the opening and the component.

2. The apparatus of claim 1, wherein the baffle has a baffle width, the component has a component width measured parallel to the baffle width, and the baffle width is equal to or greater than the component width.

3. The apparatus of claim 1, further comprising:
a substrate table configured to support the substrate,
wherein the baffle comprises a generally vertical portion that extends in a direction generally between the projection system and the substrate table.

4. The apparatus of claim 1, wherein:
a first portion of the baffle extends along a first edge of the component proximal to the opening, a second and third portion of the baffle extends along at least part of a second edge and a third edge of the component, and the second and third edges are adjacent the first edge.

5. The apparatus of claim 1, wherein a portion of the baffle comprises a getter or/and a flexible material.

6. The apparatus of claim 1, wherein:
the projection system further comprises a dynamic gas lock, and
the opening of the projection system corresponds to an opening in the dynamic gas lock.

7. The apparatus of claim 1, wherein the baffle is formed integrally with the projection system.

8. The apparatus of claim 1, further comprising a supply line configured to deliver gas generally towards the substrate.

9. The apparatus of claim 8, wherein a gas emitting end of the supply line is disposed between the opening and the component of the position monitoring system.

10. The apparatus of claim 9, wherein the gas emitting end of the supply line is disposed between the baffle and the component of the position monitoring system.

11. The apparatus of claim 9, wherein:
the gas emitting end has a gas emitting end width,
the component of the position monitoring system has a component width measured parallel to the gas emitting end width, and
the gas emitting end width is equal to or greater than the component width.

12. The apparatus of claim 9, wherein:
a first portion of the gas emitting end extends along a first edge of the component proximal to the opening,
a second and third portion of the gas emitting end extends along a second and third edge of the component, and
second and third edges are adjacent the first edge.

13. A lithographic apparatus comprising:
a position monitoring system configured to determine a position of a substrate with respect to a projection system configured to project a radiation beam through an opening in the projection system and onto the substrate, wherein a component of the position monitoring system is located beneath the projection system in use, and wherein the component comprises a reflective surface of an interferometer or a scale of a linear encoder; and
a baffle disposed between the opening and the component.

14. A method comprising:
using a projection system to project a radiation beam through an opening in a projection system and onto an exposure area of a substrate;
using a position monitoring system to determine a position of the substrate with respect to the projection system, a component of the position monitoring system being located beneath the projection system, and wherein the component comprises a reflective surface of an interferometer or a scale of a linear encoder; and
using a baffle between the opening and the component to deflect the flow of gas between the exposure area and the component.

15. A device manufactured using a position monitoring system configured to determine a position of a substrate with respect to a projection system and configured to project a radiation beam through an opening in the projection system and onto a substrate, a component of the position monitoring system being located beneath the projection system in use, and wherein the component comprises a reflective surface of an interferometer or a scale of a linear encoder; and a baffle disposed between the opening and the component.

16. A device manufactured using operations comprising:
using a projection system to project a radiation beam through an opening in the projection system and onto an exposure area of a substrate;
using a position monitoring system to determine a position of the substrate with respect to the projection system, a component of the position monitoring system being located beneath the projection system, and wherein the component comprises a reflective surface of an interferometer or a scale of a linear encoder; and
using a baffle between the opening and the component to deflect the flow of gas between the exposure area and the component.

* * * * *